United States Patent [19]

Wagner

[11] Patent Number: 4,707,653
[45] Date of Patent: Nov. 17, 1987

[54] FREQUENCY MEASUREMENT CIRCUIT

[75] Inventor: Steven D. Wagner, San Jose, Calif.

[73] Assignee: Ampex Corporation, Redwood City, Calif.

[21] Appl. No.: 788,352

[22] Filed: Oct. 17, 1985

[51] Int. Cl.[4] .................................... G01R 23/02
[52] U.S. Cl. ............................ 324/78 R; 324/79 R
[58] Field of Search ............... 324/77 R, 77 B, 78 R, 324/78 D, 78 F, 78 Z, 79 R, 79 D; 328/151

[56] References Cited

U.S. PATENT DOCUMENTS

| | | | |
|---|---|---|---|
| 3,387,222 | 6/1968 | Hellwarth et al. | 329/192 |
| 3,502,993 | 3/1970 | Schurzinger | 328/151 |
| 3,534,261 | 10/1970 | Haner et al. | 324/79 R |
| 3,673,391 | 6/1972 | Lougheed | 235/150.3 |
| 3,820,021 | 6/1974 | Clarisse | 324/79 D |
| 3,895,293 | 7/1975 | Munz | 324/78 Z |
| 3,992,666 | 11/1976 | Edwards et al. | 324/77 R |
| 4,073,432 | 2/1978 | Schroder | 324/78 D |
| 4,236,110 | 11/1980 | Shearer et al. | 324/79 R |
| 4,253,373 | 3/1981 | Foerst | 324/79 D |
| 4,280,387 | 7/1981 | Moog | 324/78 F |
| 4,281,577 | 8/1981 | Middleton | 324/79 D |
| 4,345,206 | 8/1982 | Skalka | 324/79 R |
| 4,424,482 | 1/1984 | Drogin | 324/77 B |
| 4,430,611 | 2/1984 | Boland | 324/77 B |
| 4,468,614 | 8/1984 | Takahashi | 324/78 D |
| 4,471,299 | 9/1984 | Elmis | 324/79 D |
| 4,485,396 | 11/1984 | Sandberg | 358/27 |

FOREIGN PATENT DOCUMENTS 0924601  4/1982  U.S.S.R. .................. 324/78 D

*Primary Examiner*—Michael J. Tokar
*Attorney, Agent, or Firm*—Nat Kallman; George B. Almeida; Joel D. Talcott

[57] ABSTRACT

A frequency measuring circuit measures the period between successive pulses of an input signal and converts the pulse count to a measured frequency value. The measured frequency signal is filtered to eliminate spurious noise and a variable threshold is generated by comparing the measured frequency and the filtered frequency. Only frequency signals qualified by the variable threshold are accepted as valid and provided as the output.

19 Claims, 1 Drawing Figure

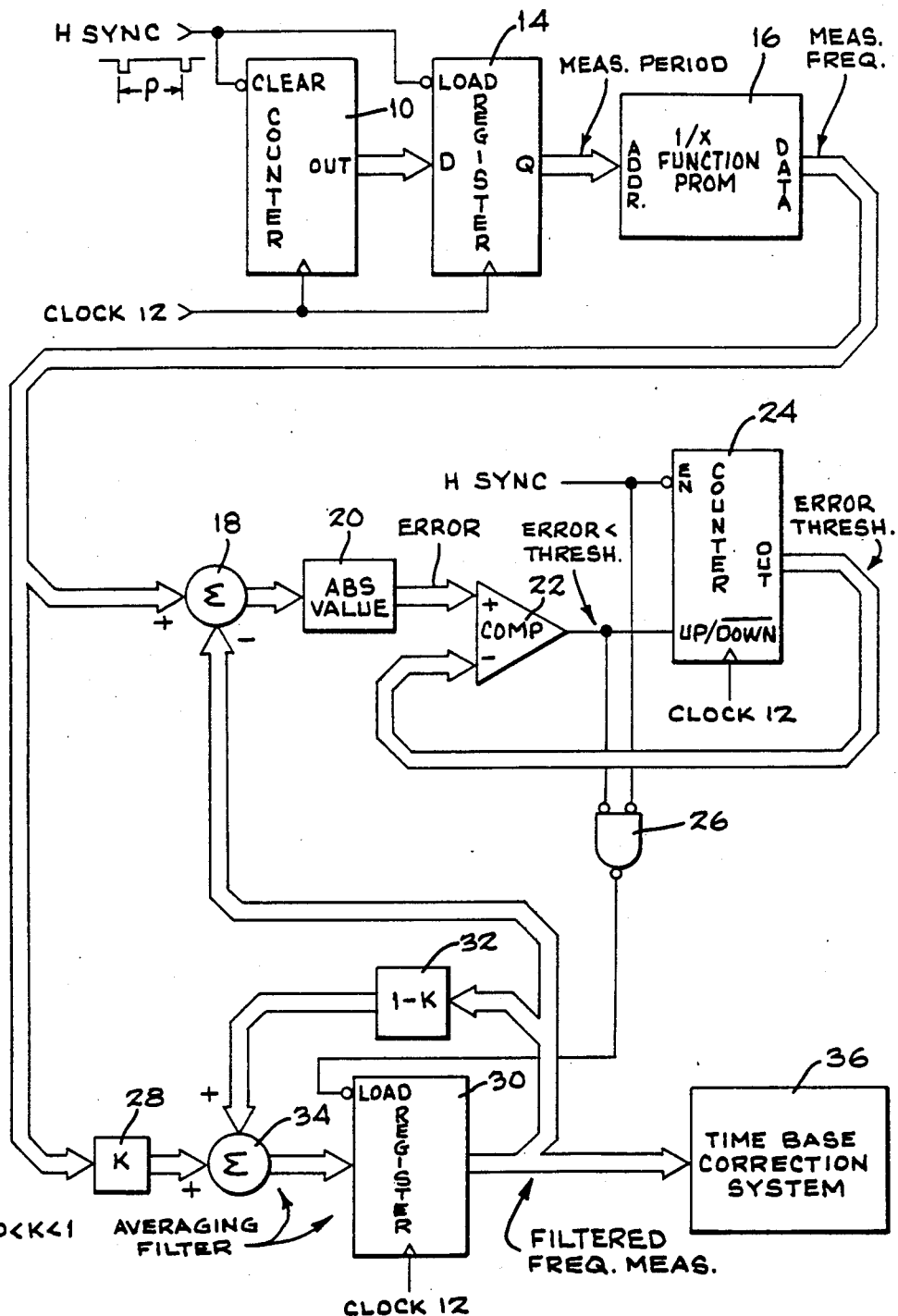

FREQUENCY MEASUREMENT CIRCUIT

BACKGROUND AND SUMMARY OF THE INVENTION

This invention relates to a circuit for measuring the frequency of a signal, and in particular to a circuit that rejects noise and spurious signals while accepting valid signals for frequency measurements.

In systems that employ circuits to compensate for timing errors present in a processed signal, the presence of noise, spurious input signals, missing signals or other signal condition anomalies adversely affects the performance of the compensation circuit. One undesirable result is that systems relying on such compensation circuits take a relatively long time, over many periods of the input signal, to recover to normal operating conditions following the occurrence of a signal anomaly. Also, in order to determine the frequency of the incoming pulse signal it is common to count the number of pulses or transitions that occur within a predetermined period. In such systems, it takes a relatively long time to determine the frequency, whereupon frequency and phase compensation and thus timing stability are unduly delayed to the detriment of the system operation. Therefore it would be desirable to reject rapidly those signal anomalies such as noise, and to accept rapidly only those signals which are within defined parameters and, therefore, considered valid.

The invention overcomes the disadvantage of previous mention by providing a circuit for rapidly and continuously measuring the frequency of a signal which may contain noise. The circuit incorporates a frequency measuring circuit, and an averaging circuit that continually averages previous frequency measurements over a long term. The difference in frequency between the averaged value and the current frequency measurement provides an error signal. The error signal is compared to a threshold value to determine whether a signal is to be accepted as valid or rejected as noise. The threshold is adjusted for each period defined by two adjacent pulses by incrementing by one count when an existing error is found to be greater than the threshold value. If the existing error is less than the threshold then the threshold value is decremented. Thus the threshold automatically is adjusted for successive periods between adjacent pulses, which enables a rapid and accurate determination for qualifying valid pulses.

The circuit is particularly useful in a time base correction system for a video tape signal processing apparatus when the system senses that the frequency of the tape clock is characterized by a large error.

BRIEF DESCRIPTION OF THE DRAWING

The invention is described with reference to the drawing in which the sole FIG. is a schematic block diagram of an implementation of the invention.

DESCRIPTION OF THE PREFERRED EMBODIMENT

With reference to the drawing, an input pulse signal having an unknown frequency is applied to a counter 10 which is under control of a fixed frequency clock on a line 12. The fixed frequency clock operates at a relatively high frequency such as 10 MHz, by way of example, and affords high resolution operation of the system. For purpose of explanation, the input pulse signal used in this description is a horizontal sync pulse derived from a recorded video tape, generally having a frequency in the range of 15.75 KHz.

In operation, the counter 10 is cleared by a first narrow horizontal sync pulse to provide the counter at an all zero state. The counter 10 counts from the first horizontal sync pulse that it senses to the following second horizontal sync pulse, whereupon the accumulated count is loaded into a register 14. The count is reset by the leading edge of each horizontal sync pulse and counts up for each period between the pulses. The count number represents the period measured in clock cycles between adjacent horizontal sync pulses. The register provides a binary number output which is proportional to the period between the leading edges of the input pulses. This binary number is fed to a programmed read only memory (PROM) 16 which includes a lookup table providing a 1/X function for generating a measured frequency signal that is inversely related to the measured period signal obtained at the output of the register 14.

The measured frequency, which by this simplified circuitry is rapidly obtained from the measured period, is applied to a subtractor 18 at the input stage of an error threshold channel. The subtractor 18 also receives a filtered frequency measurement signal from the output of an averaging filter channel, as described hereinafter, which provides a signal to the subtractor representing the average of a series of successive frequency measurements. The output from the subtractor 18 is processed by an absolute value circuit 20 to produce an absolute binary signal representing the error between the measured frequency from the PROM 16 and the filtered average frequency measurement from the channel which performs an averaging of the measured frequencies. The error signal is applied to a comparator 22 which forms a feedback loop with a counter 24 for generating a variable threshold, in accordance with this invention. The counter 24 is clocked by the clock on line 12 of previous mention. The threshold varies in accordance with the absolute values of the error signal received from the absolute value circuit 20.

For each measurement of the signal frequency, the counter 24 counts up or down depending upon the value of the error. If the error is greater than the existing threshold, the signal is rejected and the threshold value is incremented by a one count unit. Conversely, if the error of the measured frequency is less than the existing threshold, the counter is decremented to decrease the level of the threshold. Thus the feedback circuit tolerates errors of lower value and rejects those above the newly created threshold. Since the increment or decrement of the threshold is accomplished by one unit for each error sensed, the circuit effectively responds in gradual steps to change the threshold linearly, whereby the circuit is not over-responsive.

In order to obtain a frequency value for comparison in the comparator 22, the averaging filter channel is employed to provide a filtered frequency measurement so that noise signals are not introduced into the circuit for establishing the proper threshold. When the error signal sensed from the comparator is less than the threshold, a low logic signal is provided to an AND gate 26 which also receives a low signal from the horizontal input pulse. Therefore, when the error signal is below the threshold level, the AND logic circuit 26 provides a signal to register 30, which is under control of the clock on the line 12. The averaging filter channel, which receives the measured frequency, includes a constant multiplier 28 that acts as a filter and provides a fraction, for example 1/16th, of the current measured frequency signal obtained from the PROM 16. The filter channel also includes a 1-K constant multiplier 32 which provides a signal, in this example, of 15/16ths of the filtered and measured signal received from the register 30. The multipliers 28 and 32 provide their outputs to an adder 34 which replaces the previous value of the measured frequency signal with the current value of the measured frequency signal and applies the latter to the register 30. When the logic signal from AND gate 26 to register 30 goes low, new frequency data is loaded and passed to the adder 18 for processing through the error threshold channel to provide adjustment of the threshold. The new frequency data is circulated through the 1-K constant multiplier 32 and back to the adder 34 to weight and reinforce the new frequency data.

By way of example only, the new filtered frequency measurement signal is utilized for the timing circuits of a time base correction system, depicted by the block and numeral 36, to aid in coarse corrections of frequency of an off-tape related clock. When the system senses that the frequency of the tape clock is characterized by a large error, the magnitude of the error is determined by comparing a primary frequency control word and a secondary frequency control word in a pair of comparators (not shown) of the system. When the error exceeds a given value, ±5% for example, the frequency measurement circuit of this invention is automatically switched in to effectuate rapid frequency lock prior to time base correction.

There has been described herein a frequency measuring circuit with adaptive noise rejection capability, particularly applicable for measuring the frequency associated with horizontal sync pulses in the presence of noise, which herein are derived from a recorded TV signal. The novel circuit of this invention rejects spurious frequency measurements by comparing them to a long term average of previous frequency measurements. Only those measurements within a specified error and less than the current threshold are accepted to update the average. The threshold is adjusted for each period to minimize the number of erroneous measurements which are accepted as valid. As a result, noise is effectively removed from the frequency signal being processed, and the signal is then passed to a utilization apparatus, such as a time base correction system, for further processing.

What is claimed is:

1. A frequency measurement circuit comprising:
   a source of input pulse signals;
   means for producing a measured frequency signal indicative of the frequency of the input pulse signals;
   first channel means receiving said measured frequency signal for producing an averaged frequency signal corresponding to the average of a selected number of the measured frequency signals;
   second channel means coupled to receive said measured frequency signal and said averaged frequency signal for generating a difference error signal indicative of the difference between the signals;
   said second channel means includes means for producing a variable threshold, which threshold is increased if the difference error signal is greater than the threshold and decreased if it is less than the threshold; and
   said first channel means includes means for updating the averaged frequency signal when the difference error signal is less than the threshold.

2. The circuit of claim 1 wherein said means for producing a variable threshold includes a comparator for comparing a current threshold value with said difference error signal.

3. The circuit of claim 2 wherein the means for producing a variable threshold further includes:
   an absolute value circuit coupled to the input of said comparator; and
   an up/down counter coupled to the output of the comparator.

4. The circuit of claim 1 wherein said means for producing the measured frequency signal includes:
   a pulse counter; and
   a register coupled to said counter.

5. The circuit of claim 4 wherein said counter and register are timed by a fixed reference clock.

6. The circuit of claim 1 wherein said means for producing the measured frequency signal includes a 1/X function programmed read only memory.

7. The circuit of claim 1 wherein said first channel means includes:
   averaging filter means coupled at its output to the second channel means.

8. The circuit of claim 7 wherein the averaging filter means includes:
   a first constant multiplier;
   an adder coupled to the first constant multiplier;
   a register coupled to the adder for supplying the averaged frequency signal; and
   a second constant multiplier, which is complementary to said first constant multiplier, coupled from the register back to the adder.

9. The circuit of claim 7 further including a logic circuit coupled to receive the difference error signal and for enabling the averaging filter means when said difference error signal is less than the threshold.

10. A system for processing pulse signals while rejecting noise in the signals, comprising:
    means for measuring the frequency of the pulse signals;
    means for averaging the frequency values of a number of preceding pulse signals;
    means for subtracting said averaged signal from a measured signal and for generating a difference error signal indicative of the difference;
    means for generating a threshold value and for adjusting such threshold value in response to said difference error signal; and
    wherein the measured signal that has a frequency value greater than said threshold value is rejected and that which has a value below said threshold value is used to adjust the threshold.

11. A circuit for adaptively measuring the frequency of pulse signals while rejecting noise, comprising:
    means for providing a measured frequency signal corresponding to the frequency of the pulse signals;
    means coupled to the providing means for supplying an averaged frequency signal from the measured frequency signals, which averaged frequency signal corresponds to the output signal of the circuit; and
    threshold means coupled to the providing means and to the supplying means for generating a variable threshold which is increased if the combined measured frequency and averaged frequency signals are greater than the threshold, and which is decreased if the combined signals are less than the threshold.

12. The circuit of claim 11 wherein:
said threshold means provides a threshold which is indicative of the measured frequency signal being valid; and
said supplying means updates the averaged frequency signal when the combined signals are less than said threshold.

13. The circuit of claim 11 wherein the threshold means includes:
means for subtracting the averaged frequency signal from the measured frequency signal to provide a difference error signal;
comparator means coupled to the means for subtracting; and
counter means coupled from the output back to the input of the comparator means for generating the variable threshold in response to the difference error signal.

14. The circuit of claim 13 including:
logic means coupled from the comparator means to the supplying means for enabling the latter in response to the difference error signal being less than the variable threshold.

15. The circuit of claim 11 wherein the means for supplying the averaged frequency signal includes:
an adder means for receiving the measured frequency signal;
register means coupled to the adder means for supplying the averaged frequency signal as the output signal; and
constant multiplier means coupled from the register means output to the adder means.

16. A method of measuring the frequency of a signal while rejecting spurious noise in the signal, comprising:
measuring the frequency of an input pulse signal to provide a measured signal;
producing an averaged signal representative of a time average of said measured signal;
subtracting said averaged signal from said measured signal to generate a difference error signal;
establishing a variable threshold value indicative of said difference error signal; and
decreasing the threshold value in response to the difference error signal being less than the variable threshold value.

17. The method of claim 16 wherein the step of establishing the threshold value comprises:
incrementing said threshold value when the error signal has a value greater than the threshold value; and
decrementing said threshold value when said error signal is less than the threshold value.

18. The method of claim 17 including:
generating an enabling logic signal when the error signal is less than the threshold value; and
enabling the step of producing in response to the enabling logic signal to update the averaged signal.

19. The method of claim 18 including:
combining the previous averaged signal with the current measured signal in response to the enabling logic signal to update the averaged signal.

* * * * *